(12) United States Patent
Lin et al.

(10) Patent No.: US 6,580,645 B1
(45) Date of Patent: Jun. 17, 2003

(54) PAGE BUFFER OF A FLASH MEMORY

(75) Inventors: Yen-Tai Lin, Hsin-Chu (TW); Chien-Hung Ho, Hsin-Chu (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 10/065,660

(22) Filed: Nov. 7, 2002

(30) Foreign Application Priority Data

May 23, 2002 (TW) ............................. 091110959 A

(51) Int. Cl.[7] ............................................. G11C 16/00
(52) U.S. Cl. ........................ 365/185.23; 365/189.05
(58) Field of Search .................. 365/185.23, 189.05, 365/230.08, 235

(56) References Cited

U.S. PATENT DOCUMENTS 5,509,134 A * 4/1996 Fandrich et al. ........ 365/189.05
5,671,178 A * 9/1997 Park et al. .............. 365/185.23
6,424,575 B1 * 7/2002 Pascucci ................. 365/189.05

* cited by examiner

Primary Examiner—Tan T. Nguyen
(74) Attorney, Agent, or Firm—Winston Hsu

(57) ABSTRACT

A page buffer for a flash memory has a power supply, a latch circuit, and a plurality of switches. Initially the switches are controlled for resetting a first terminal and a second terminal of the latch circuit to a respective predetermined voltage. If a memory cell is not to be programmed, the voltage levels of the first terminal and the second terminal remain unchanged when the power supply outputs a programming voltage. If the memory cell is to be programmed, the voltage levels of the first terminal and the second terminal are changed when the power supply outputs the programming voltage. Each of the first terminal and the second terminal will regain the predetermined voltage after the memory cell is completely programmed to store a predetermined binary digit.

16 Claims, 4 Drawing Sheets

PAGE BUFFER OF A FLASH MEMORY

BACKGROUND OF INVENTION

1. Field of the Invention

The present invention relates to a page buffer. In particular, the present invention discloses a page buffer with an improved programming efficiency for a non-volatile memory.

2. Description of the Prior Art

Recently, flash memory technology is quickly developed owing to a great demand for portable electric products. The flash memory related market is also further advancing associated researches into flash memory devices. The portable electric products include digital cameras, cellular phones, video game apparatus, personal digital assistants, electric recorders, and programmable ICs. For example, digital cameras need the flash memory to replace the traditional film, and the cellular phones, video game apparatus, personal digital assistants, electric recorders, and programmable ICs require the flash memory to store data or programs.

The flash memory is a non-volatile memory. That is, the flash memory records data through changing a threshold voltage of a transistor or a memory cell to control a gate channel induced at the transistor or the memory cell. The data stored in the flash memory, therefore, will not be cleared or lost even thought a corresponding operating voltage of the flash memory is turned off. The flash memory is viewed as a special structure of an electrically erasable and programmable read only memory (EEPROM).

Please refer to FIG. 1, which is a structure diagram of a prior art EEPROM 10. EEPROM 10 has a substrate 12, a source 14, a drain 16, a floating gate 18, and a control gate 20. The floating gate 18 is separated from a channel 22 positioned in the substrate 12 by an oxide layer 24. The substrate 12 is electrically connected to a reference voltage Vbb. Generally speaking, a ground voltage is often used as the reference voltage. If the EEPROM 10 has an N-channel metal oxide semiconductor (NMOS) structure, the substrate 12 is a p-doped area, and the source 14 and the drain 16 are n-doped areas. On the contrary, if the EEPROM 10 has a P-channel metal oxide semiconductor (PMOS) structure, the substrate 12 is an n-doped area, and the source 14 and the drain 16 are p-doped areas.

Operation of the EEPROM 10 is briefly described as follows. A voltage Vcg inputted into the control gate 20 is capable of altering the total amount of electrons stored on the floating gate 18. A threshold voltage related to formation of the channel 22 is affected by the amount of electrons stored on the floating gate 18. Therefore, the EEPROM 10 senses two states ("0" and "1") according to the amount of electrons stored on the floating gate 18 while performing a reading operation. The amount of electrons is adjusted by driving electrons from the channel 22 to the floating gate 18 or by expelling electrons from the floating gate 18. When the floating gate 18 stores more electrons, the threshold voltage related to formation of the channel 22 is increased. On the other hand, when the floating gate 18 stores fewer electrons, the threshold voltage related to formation of the channel 22 is decreased. In order to make the source 14 and the drain 16 of the EEPROM 10 electrically connected, the control voltage Vcg is inputted into the control gate 20 trying to overcome the existing threshold voltage affected by electrons on the floating gate 18.

Therefore, current passing through the source 14 and the drain 16 is sensed to determine whether a binary digit "0" or a binary digit "1" is stored by the EEPROM 10. If the control voltage Vcg is high enough to overcome the threshold voltage (fewer electrons stored on the floating gate 18), the detected current value is high. On the contrary, if the control voltage Vcg is not high enough to overcome the threshold voltage (more electrons stored on the floating gate 18), the detected current value is low. The data recorded on the EEPROM 10 is easily read owing to different threshold voltages.

For the sake of programming the EEPROM 10, the total amount of electrons stored on the floating gate 18 must be precisely controlled to obtain a required threshold voltage. A Fowler-Nordheim tunneling or a hot electron injection is normally adopted to control electrons on the floating gate 18. For example, the hot electron injection is performed by inputting the control voltage Vcg with 10 volts into the control gate 20, inputting a voltage Vd with 5 volts into the drain 16, and inputting a ground voltage Vs into the source 14. When electrons move from the source 14 to the drain 16 via the channel 22, an electric field built between the control gate 20 and the source 14 and an electric field built between source 14 and the drain 16 accelerate the electrons positioned around the drain 16 so that the electrons will achieve high kinetic energy. In the end, the positive voltage at the control gate 20 will attract electrons that have overcome a potential energy barrier existing in the oxide layer 24, and pulls electrons up to the floating gate 18.

The Fowler-Nordheim tunneling is performed by inputting the control voltage Vcg with 7 volts to the control gate 20, inputting a positive voltage Vs to the source 14, and floating the drain 16. An electric field is built between the source 14 and the control gate 20, and pierces the oxide layer 24. The electrons positioned on the floating gate 18 are affected by the electric field established between the control gate 20 and the source 14, and are energized to overcome the potential energy barrier existing in the oxide layer 24. In the end, the electrons will tunnel through the oxide layer 24 and reach the source 14. Compared with other memory devices such as a dynamic random access memory (DRAM), the flash memory requires a longer period of time to finish charging and discharging the floating gate 18 to record data. The data access speed of the flash memory, therefore, is limited by the above-mentioned drawback.

Please refer to FIG. 2, which is a block diagram of a prior art flash memory device 30. The flash memory device 30 has a controller 32, a sense amplifier 34, a status register 36, a charge pump circuit 38, an X decoder 40, a Y decoder 42, and a memory 44. The memory 44 has a plurality of memory cells 46 arranged in a matrix format for storing binary data. The controller 32 is used to control operation of the flash memory device 30 to access each memory cell 46 of the memory 44. The status register 36 records a current operating status (programming, reading, or erasing) related to the memory 44.

A computer system, therefore, reads the status register 36 through the controller 32 to decide a succeeding operation suitable to be applied upon the flash memory device 30. The sense amplifier 34 reads the memory cells 46, and amplifies a corresponding result detected from the memory cell 46. The charge pump circuit 38 is used to provide the memory cells 46 with appropriate voltages required for performing programming, reading, or erasing operations. The X decoder 40 and the Y decoder 42 are used to locate each memory cell 46 with an associated memory address such as a specific column and a specific row. Each memory cell 46 does not have exactly the same structure owing to many unexpected variations induced during the semiconductor process.

Therefore, the quantity of electrons passing through the oxide layer 24 to the floating gate 18 is not easy to predict and control. In other words, an external voltage such as the control voltage Vcg does not precisely adjust a desired amount of the electrons stored on the floating gate 18. When the X decoder 40 receives data transmitted from the controller 32, and decodes the data to locate the memory cell 46 on row n, the Y decoder 42 also receives data transmitted from the controller 32, and decodes the data to program each memory cell 46 at the same row n according to an associated voltage generated by the charge pump circuit 38. Therefore, each memory cell 46 located at the row n will record a corresponding binary digit based on the data generated from the controller 32.

As mentioned above, each memory cell 46 has a specific characteristic. Some of the memory cells 46 will be successfully programmed after a predetermined time, but other memory cells 46 may not be correctly programmed owing to the individual characteristics. The flash memory 30, therefore, has to check whether each memory cell 46 at the n column is programmed successfully. That is, a verification operation is applied to check whether the floating gate 18 of each memory cell 46 has stored an appropriate amount of electrons according to the data transmitted by the controller 32.

However, it takes much time to check each memory cell 46 individually. In addition, when the flash memory 30 detects that one memory cell 46 is not programmed successfully, all the memory cells 46 located at the column n have to be programmed repeatedly until the data stored on the memory cells 46 are identical to the data transmitted from the controller 32. If there is one bit within one byte that does not record the right value, the byte will be programmed repeatedly to store the exact data. It is obvious that the repeated programming operation is time-consuming, and deteriorates access efficiency of the flash memory 30. In addition, excessive programming operations applied on the same memory cell 46 will damage the physical structure of the memory cell 46 so that the memory cell 46 may malfunction henceforth.

SUMMARY OF INVENTION

It is therefore a primary objective of this invention to provide a page buffer of a flash memory to improve programming efficiency.

Briefly summarized, the preferred embodiment of the claimed invention discloses a page buffer for updating data stored in a memory cell of a flash memory according to an input signal. The page buffer includes a power supply for outputting a first voltage and a second voltage, a latch circuit having a first terminal and a second terminal, and a plurality of switches. For the latch circuit, one of the first and second terminals approaches a high voltage level when another one approaches a low voltage level. The latch circuit is used to latch voltage levels of the first and second terminals according to the input signal inputted into either the first terminal or the second terminal.

The switches include a first switch electrically connected between the power supply and the first terminal of the latch circuit, a second switch electrically connected to the second terminal of the latch circuit, a third switch electrically connected to the first terminal of the latch circuit, a fourth switch whose one end is electrically connected to the power supply and another end is electrically connected to the second switch and the third switch, and a fifth switch electrically connected between the second terminal of the latch circuit and the memory cell.

The first switch is controlled to drive each of the first and the second terminals of the latch circuit to a predetermined voltage respectively during a first period. The second and the fourth switches are controlled to adjust voltage levels of the first and the second terminals of the latch circuit based on the input signal during a second period after the first period. The fifth and the fourth switches are controlled to refresh the memory cell based on the input signal during a third period after the second period. The third and the fourth switches are controlled to verify whether a data stored in the memory cell is identical to the input signal during a fourth period after the third period.

The memory cell is successfully updated according to the input signal if the data stored in the memory cell is identical to the input signal. However, if the data stored in the memory cell is not identical to the input signal, each operation performed during the third and fourth periods is started repeatedly until the data stored in the memory cell is identical to the input signal.

It is an advantage of the claimed invention to use switches to control operation of the page buffer. Therefore, each page buffer is independent, and is used to program a corresponding memory cell. The page buffer is started to program the corresponding memory cell repeated only until the memory cell has been programmed successfully. At the same time, other page buffers are disabled without programming corresponding memory cells again if the memory cells have been programmed successfully. The claimed page buffers can avoid programming all of the memory cells at the same word line repeatedly if there is one memory cell that cannot store the correct data by keeping an appropriate amount of electrons on the floating gate. In other words, the possibility of damaging the physic structure of the memory cell owing to excessive programming operation is reduced, and the normal functioning of the flash memory is maintained for a longer period.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 3:
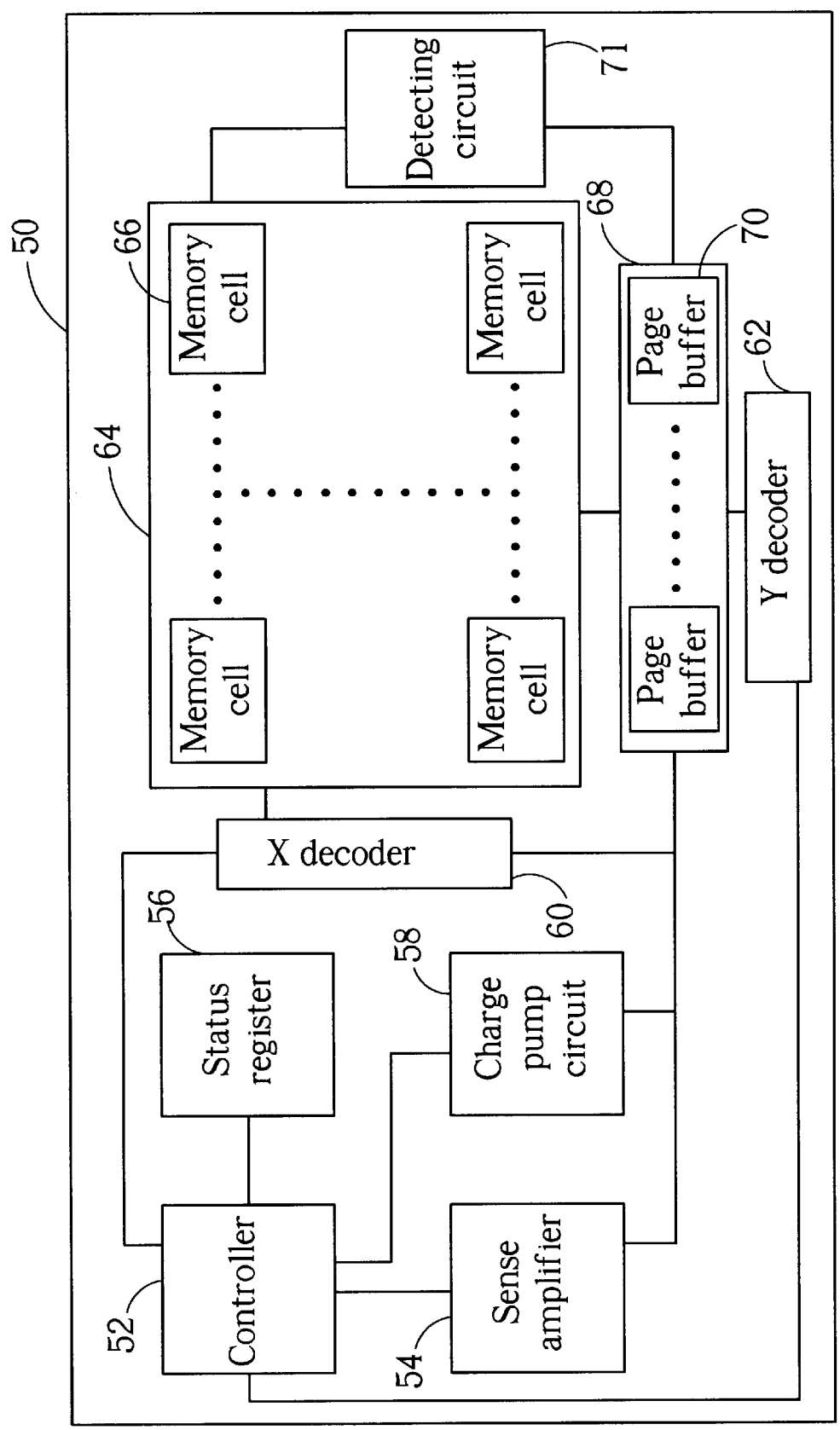
FIG. 3 is a block diagram of a flash memory according to the present invention.

Please refer to FIG. 3, which is a block diagram of a flash memory 50 according to the present invention. The flash memory 50 has a controller 52, a sense amplifier 54, a status register 56, a charge pump circuit 58, an X decoder 60, a Y decoder 62, a memory 64, a buffer 68, and a detecting circuit 71. The memory 64 has a plurality of memory cells 64 arranged in a matrix format for recording binary data. The buffer 68 has a plurality of page buffers 70. Each page buffer 70 corresponds to one set of memory cells, that is, one memory cell 66 on a specific word line is connected to a corresponding page buffer 70. For example, if there are 1024 memory cells 66 located on each word line, the buffer 68 has 1024 page buffers 70.

The detecting circuit 71 is connected between the memory 64 and the buffer 68 for reading the memory cells 66 and for providing the page buffer 70 with a current status of the memory cell 66 after the page buffer 70 programs the corresponding memory cell 66. Therefore, the page buffer 70 can determine whether a programming operation should be performed again to program the memory cell 66 according to status of the memory cell 66. When the X decoder 60 receives data from the controller 32, and decodes data to locate memory cells 66 at the word line n.

In addition, the Y decoder 62 will receive data from the controller 52, and decodes the data to locate all of the memory cells 66 at the word line n. Then, each page buffer 70 will respectively program a corresponding memory cell 66 according to the voltage generated from the charge pump circuit 58. In the end, the detecting circuit 71 will verify whether the memory cell 66 has been programmed successfully or not. For example, after the X decoder 60 and the Y decoder 62 receive data generated by the controller 52, memory addresses related to memory cells 66 required for programming are decoded and determined. The page buffer 70 will program a corresponding memory cell 66 according the voltage outputted from the charge pump circuit 58 and the memory address decoded by the X decoder 60 and the Y decoder 62. After a predetermined period, the detecting circuit 71 will detect the status of each memory cell 66 to determine whether the memory cell 66 has been programmed successfully. If one of the memory cells 66 is not correctly programmed, only the page buffer 70 corresponding to the memory cell 66 will be activated to program the memory cell 66 again. However, other page buffers corresponding to programmed memory cells 66 will not be activated at this time. Therefore, the page buffer 70 determines whether to program the corresponding memory cell 66 based on the status of the memory cell 66 sensed by the detecting circuit 71. The above programming operation is repeated until all of the memory cells 66 required to be programmed are successfully programmed.

Figure 4:
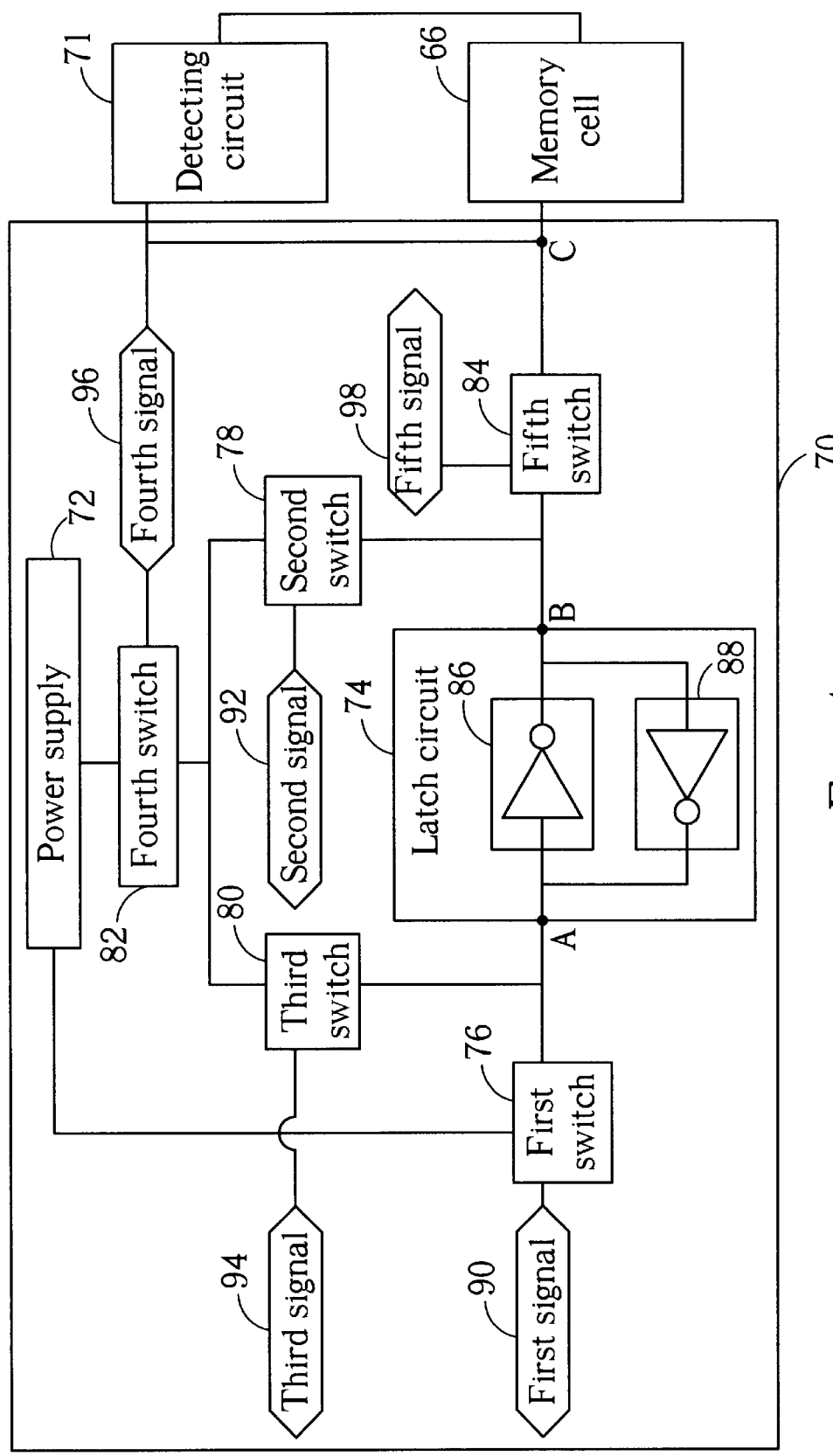
FIG. 4 is a block diagram of the page buffer shown in FIG. 3.

Please refer to FIG. 4, which is a block diagram of the page buffer 70 shown in FIG. 3. The page buffer 70 has a power supply 72, a latch circuit 74, a firsts witch 76, a second switch 78, a third switch 80, a fourth switch 82, and a fifth switch 84.

Figure 1:
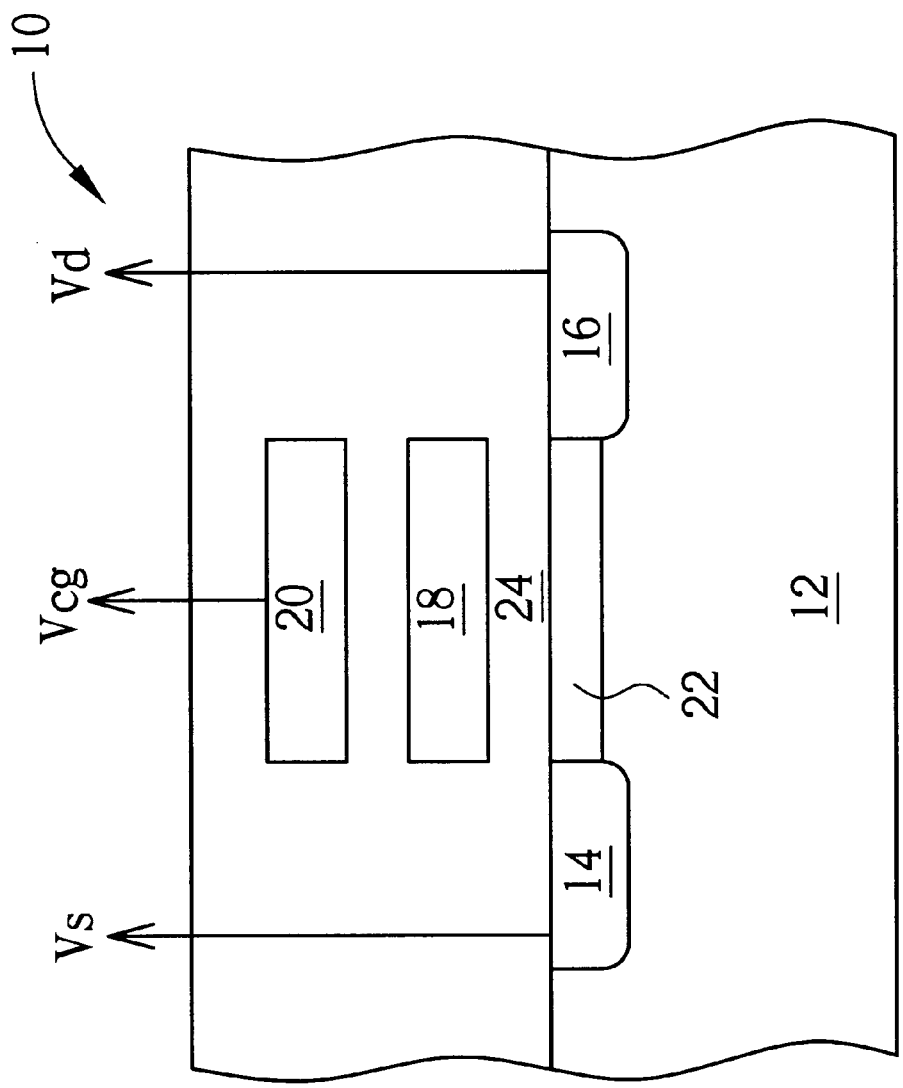
FIG. 1 is a structure diagram of a prior art EEPROM.
Figure 2:
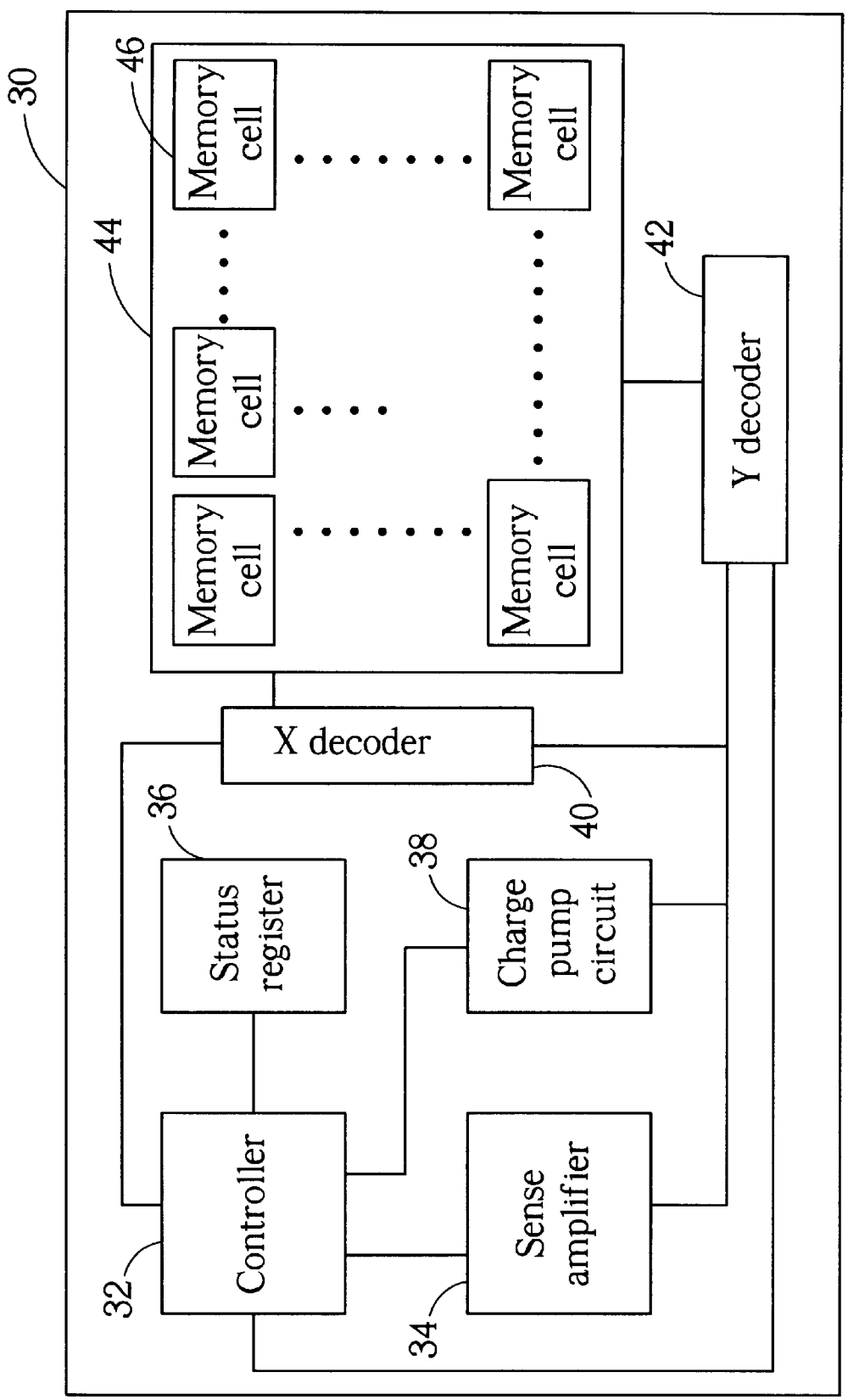
FIG. 2 is a block diagram of a prior art flash memory device.

The power supply 72 is used to provide the page buffer 70 with an operating voltage and a programming voltage used for programming the memory cell 66. It is noteworthy that the programming voltage is generated from the charge pump circuit 58, and the operating voltage (3 volts for example) of the page buffer 70 is not high enough to program the memory cell 66 connected to the page buffer 70. For example, when the memory cell 66 is erased to store a binary digit "0", the control gate 20 shown in FIG. 1 has a negative voltage such as 5 volts, and the drain 16 shown in FIG. 1 has the programming voltage such as 10 volts so that the electrons are expelled from the floating gate 18. However, a difference between the operating voltage at the drain 16 and the negative voltage at the control gate 20 is not high enough to expel electrons from the floating gate 18. That is, the operating voltage with a lower voltage level is not capable of programming the memory cell 66 related to the corresponding page buffer 70. The latch circuit 74 has two inverters 86, 88. When a high voltage is inputted into node A, the inverter 86 will force node B to have a low voltage. Similarly, when a low voltage is inputted into node A, the inverter 86 will force node A to have a high voltage. Finally, the latch circuit 74 will latch voltage levels at nodes A and B.

In addition, a first signal 90 is used to control whether the first switch 76 is turned on or not. A second signal 92 is used to control whether the second switch 78 is turned on or not. A third signal 94 is used to control whether the third switch 80 is turned on or not. A fourth signal 96 is used to control whether the fourth switch 82 is turned on or not. A fifth signal 98 is used to control whether the fifth switch 84 is turned on or not. In the preferred embodiment, please note that the fourth signal 96 is inputted into the memory cell 66 through a main bit line (MBL). There is one MBL connected to each column of memory cells 66.

Operation of the page buffer 70 is mainly divided into four procedures, that is, a resetting procedure, a loading procedure, a programming procedure, and a verifying procedure. In order to disclose the page buffer 70 according to the present invention, the operation of the page buffer 70 is described by two sections. One section is related to the memory cells 66 that require programming, and another section is related to the memory cell 66 that does not require programming.

(1) The Memory Cell 66 Not Requiring Programming

Executing the Resetting Procedure:

The first signal 90 is inputted to turn on the first switch 76. In addition, the power supply 72 outputs an operating voltage (3 volts). Therefore, node A of the latch circuit 74 will keep a high voltage, and the inverter 86 will convert the high voltage into a low voltage. Finally, the latch circuit 74 latches node A at the high voltage and node B at the low voltage respectively.

Executing the Loading Procedure:

The second signal 92 is inputted to turn on the second switch 78. The detecting circuit 71 sets the fourth signal 4 as the high voltage so that the fourth switch 82 is still off. In addition, the first signal 90 will turn off the first switch 76. Therefore, the voltage levels at nodes A and B are not changed and hold the high voltage and the low voltage individually even though the second switch 78 is turned on.

Executing the Programming Procedure:

The fifth signal 98 is inputted to turn on the fifth switch 84. The power supply 72 outputs the programming voltage (10 volts). Because the fourth switch 82 is turned off, nodes A and B hold the high voltage and the low voltage respectively. With the help of the fifth switch, voltage level at node C will approach the low voltage at node B. The voltage at node C is not capable of programming the memory cell 66.

Executing the Verifying Procedure:

The third signal is inputted to turn on the third switch. The memory cell 66 does not need a programming operation so that the page buffer 70 does not program the memory cell 66 as described above. When the detecting circuit 71 reads the memory cell 66, the fourth signal 96 is set as the high voltage, and the fourth switch 82 is still turned off. Therefore, voltage levels of nodes A and B are latched at the high voltage and the low voltage respectively.

(2)The Memory Cell 66 Requiring Programming

Executing the Resetting Procedure:

The first signal 90 is inputted to turn on the first switch 76. Then power supply 72 outputs an operating voltage. Therefore, voltage level of the node A will rise to the high voltage, and the inverter 86 will force the voltage level of node B to be the low voltage. Finally, the latch circuit 74 latches nodes A and B as the high voltage and the low voltage respectively.

Executing the Loading Procedure:

The second signal 92 is inputted to turn on the second switch 78. The detecting circuit 71 sets the fourth signal as the low voltage so that the fourth switch is turned on now. The first signal 90 will turn off the first switch 76. Therefore, the operating voltage generated from the power supply 72 passes through the fourth switch 82 and the second switch 78, and forces the voltage of node B from the low voltage to the high voltage. The inverter 88 forces the voltage of node A from the high voltage to the low voltage. In the end, the latch circuit 74 latches voltage levels of nodes A and B as the low voltage and the high voltage respectively.

Executing the Programming Procedure:

The fifth signal 98 is inputted to turn on the fifth switch 84. The power supply 72 outputs the programming voltage. Because the fourth switch 82, the second switch 78, and the fifth switch 84 are turned on, the voltage level of node C will approach the programming voltage, and node C starts programming the corresponding memory cell 66 through the second switch 84 that has been turned on.

Executing the Verifying Procedure:

The third signal 94 is inputted to turn on the third switch 80. The detecting circuit 71 reads the memory cell 66 to check whether the memory cell 66 has been programmed successfully. If the memory cell 66 has been successfully programmed, the detecting circuit 71 will set the fourth signal 96 as the low voltage. The fourth signal 96 then turns on the fourth switch 82 so that the operating voltage generated from the power supply 72 drives the node A toward the high voltage. The inverter 88 will force the voltage level of node B to be the low voltage. Finally, the latch circuit 74 latches the voltage levels of nodes A and B as the high voltage and the low voltage respectively. If the memory cell 66 has not been programmed successfully, the detecting circuit 71 will set the fourth signal 96 as the high voltage. Therefore, the fourth switch 82 is not turned on so that voltage levels of nodes A and B are not affected by the third switch 80 that is turned on. That is, the latch circuit 74 still latches the voltage levels of nodes A and B as the low voltage and the high voltage. Because the memory cell 66 has not been programmed successfully, the page buffer 70 will execute the programming procedure and the verifying procedure repeatedly until the memory cell 66 is programmed successfully, and the voltage levels of nodes A and B are latched by the latch circuit 74 at the high voltage and the low voltage respectively.

As mentioned above, the page buffer 70 first latches voltage levels of nodes A and B at the high voltage and the low voltage respectively during the resetting procedure. If the memory cell 66 does not need to be programmed, the voltage levels of nodes A and B will still be latch at the high voltage and the low voltage respectively. However, if the memory cell 66 requires to be programmed, the voltage levels of nodes A and B will be latched at the high voltage and the low voltage respectively after the memory cell 66 has been programmed successfully.

In the preferred embodiment, the voltage levels of nodes A and B after the programming procedure are compared with the voltage levels of nodes A and B after the resetting procedure to determine whether the page buffer 70 has finished its operating on recording data. Because each memory cell 66 located on the same main bit line corresponds to the same page buffer 70, the flash memory 50 moves to the memory cells 66 at the next word line only when all of the memory cells 66 located at the previous word line have recorded correct data. Therefore, the flash memory 50 of the preferred embodiment reads voltage levels of nodes A and B of each page buffer 70 to judge whether the page buffer 70 has finished storing data. When each page buffer 66 has stored a desired binary digit on the corresponding memory cell 66, the flash memory 50 is capable of using the page buffers 70 to handle data storage related to the memory cells 66 at another word line.

In the preferred embodiment, the first switch 76, the second switch 78, the third switch 80, and the fifth switch 84 are NMOS transistors, whose gates are respectively connected to the first signal 90, the second signal 78, the third signal 94, and the signal 98. Therefore, the drain and the source of the NMOS transistors are electrically connected when the voltage at the gate of the NMOS transistor exceeds a predetermined positive threshold voltage. In other words, the first switch 76, the second switch 78, the third switch 80, or the fifth switch 84 is turned on when the corresponding first signal 90, the second signal 78, the third signal 94, or the fifth signal 98 holds a high voltage level. In addition, the fourth switch 82 is a PMOS transistor, whose gate is connected to the fourth signal 96. The drain and the source of the PMOS transistor are electrically connected when the voltage at the gate of the PMOS transistor is lower than a predetermined negative threshold voltage.

However, the present invention is not to be limited by the specific type of switch used. For example, the first switch 76, the second switch 78, the third switch 80, the fourth switch 82, and the fifth switch 84 may all be NMOS transistors with the fourth switch 82 comprising an inverter with the fourth switch 82 functioning as an PMOS transistor with the addition of the inverter. Or the first switch 76, the second switch 78, the third switch 80, the fourth switch 82, and the fifth switch 84 may all be PMOS transistors with the fourth switch 82 comprising an inverter to function as a PMOS transistor allowing each of the switches to still work normally to achieve the objective of the present invention. Additionally, if the first switch 76, the second switch 78, the third switch 80, and the fifth switch 84 are PMOS transistors, and the fourth switch 82 is an NMOS transistor, each of the switches is capable of working normally to achieve the objective of the present invention as well.

In contrast to the prior art page buffer, the page buffer according to the present invention utilizes a plurality switches to control the overall programming process related to a corresponding memory cell. During the resetting procedure, both nodes of the latch circuit are reset to the high voltage and the low voltage respectively. Then, the voltage levels at both nodes of the latch circuit are used to determine whether the page buffer has finished recording data on the corresponding memory cell. Because each memory cell at one word line corresponds to one specific page buffer, the page buffer will repeatedly program the corresponding memory cell until the memory cell has been programmed successfully. That is, only the memory cell whose floating gate does not hold the correct amount of electrons related to the inputted data will be repeatedly programmed by the page buffer to record the desired data. The page buffers that have finished the programming process are disabled to wait for other page buffers that have not finished recording correct data on the memory cells.

The claimed page buffers can avoid programming all of the memory cells at the same word line repeatedly if there is one memory cell can not store the correct data by keeping appropriate amount of electrons on the floating gate. In other words, the possibility of damaging the physic structure of the memory cell owing to excessive programming operation is reduced, and the normal function of the flash memory is maintained for a longer period. In addition, the claimed page buffer independently deals with a corresponding memory cell, all of the page buffers, therefore, can handle corresponding memory cells simultaneously. The time spent on the programming process is greatly reduced without programming each memory cell at the same word line sequentially. In addition, the storage efficiency of the flash memory is greatly improved, and the application field of the flash memory is further broadened.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A page buffer for updating a data stored in a memory cell of a flash memory according to an input signal, the page buffer comprising:

a power supply for outputting a first voltage and a second voltage;

a latch circuit comprising a first terminal and a second terminal, one of the first and second terminals approaching a high voltage level when another one approaches a low voltage level, the latch circuit being used for latching voltage levels of the first and second terminals according to the input signal inputted into either the first terminal or the second terminal; and a plurality of switches comprising:
     a first switch electrically connected between the power supply and the first terminal of the latch circuit;
     a second switch electrically connected to the second terminal of the latch circuit;
     a third switch electrically connected to the first terminal of the latch circuit;
     a fourth switch, one end of the fourth switch being electrically connected to the power supply, another end of the switch being electrically connected to the second switch and the third switch; and
     a fifth switch electrically connected between the second terminal of the latch circuit and the memory cell;
   wherein the first switch is controlled to drive the first and second terminals of the latch circuit to different predetermined voltages respectively during a first period, the second and fourth switches are controlled to adjust voltage levels of the first and second terminals of the latch circuit based on the input signal during a second period after the first period, the fourth switch is controlled to update the data stored in the memory cell based on the input signal during a third period after the second period, the third and fourth switches are controlled to verify whether the data stored in the memory cell is identical to input signal during a fourth period after the third period, the memory cell has been successfully updated according to the input signal if the data stored in the memory cell is identical to the input signal, and if the data stored in the memory cell is not identical to the input signal, each operation performed during the third and fourth periods is started repeatedly until the data stored in the memory cell is identical to the input signal.

2. The page buffer of claim 1 wherein the flash memory further comprises a detecting circuit for reading the data stored in the memory cell and comparing the input signal with the data stored in the memory cell to determine whether the fourth switch is turned on or not.

3. The page buffer of claim 2 wherein the first switch is turned on during the first period, and the power supply outputs the first voltage to the first terminal of the latch circuit so that the first terminal of the latch circuit approaches a voltage level and the second terminal approaches a second voltage level.

4. The page buffer of claim 3 wherein the first voltage level is the high voltage level, and the second voltage level is the low voltage level.

5. The page buffer of claim 3 wherein when the data stored in the memory cell is different from the input signal, the page buffer will perform a programming operation on the memory cell during the third period to update the data stored in the memory cell by the input signal, and the first switch is turned off and the second switch is turned on so that the power supply outputs the first voltage to the second terminal of the latch circuit for driving the second terminal to approach the first voltage.

6. The page buffer of claim 5 wherein during the third period, the fifth switch is turned on, the power supply outputs the first voltage to drive the second terminal to approach the first voltage, and the fourth switch is turned off.

7. The page buffer of claim 6 wherein during the fourth period, the third switch is turned on, the detecting circuit reads the data stored in the memory cell, and the fourth switch is turned on so that the first terminal of the latch circuit is driven toward the first voltage outputted from the power supply if the data stored in the memory cell is identical to the input signal.

8. The page buffer of claim 7 wherein if the data stored in the memory cell is different from the input signal, each operation performed during the third and fourth periods is started repeatedly until the detecting circuit determines that the data stored in the memory cell is identical to the input signal.

9. The page buffer of claim 3 wherein during the second period, the fourth switch is turned off and the second switch is turned on when the page buffer does not perform a programming operation on the memory cell because the data stored in the memory cell is identical to the input signal.

10. The page buffer of claim 9 wherein the fifth switch is turned on and the power supply outputs the second voltage during the third period.

11. The page buffer of claim 10 wherein during the fourth period, the third switch is turned on and the fourth switch is turned off after the detecting circuit reads the data stored in the memory cell.

12. The page buffer of claim 1 wherein each of the switches is a PMOS transistor.

13. The page buffer of claim 1 wherein each of the switches is an NMOS transistor.

14. The page buffer of claim 1 wherein the latch circuit comprises a plurality of inverters connected between the first and second terminals of the latch circuit.

15. The page buffer of claim 1 wherein each memory cell positioned at the same bit line respectively corresponds to one page buffer.

16. The page buffer of claim 1 wherein the flash memory further comprises a charge pump circuit for generating the first voltage.

* * * * *